(12) United States Patent
Tsuzumitani

(10) Patent No.: US 7,879,661 B2
(45) Date of Patent: Feb. 1, 2011

(54) SEMICONDUCTOR DEVICE AND METHOD FOR FABRICATING THE SAME

(75) Inventor: Akihiko Tsuzumitani, Kyoto (JP)

(73) Assignee: Panasonic Corporation, Osaka (JP)

( * ) Notice: Subject to any disclaimer, the term of this patent is extended or adjusted under 35 U.S.C. 154(b) by 362 days.

(21) Appl. No.: 12/073,609

(22) Filed: Mar. 7, 2008

(65) Prior Publication Data
US 2008/0166868 A1    Jul. 10, 2008

Related U.S. Application Data

(62) Division of application No. 11/474,391, filed on Jun. 26, 2006, now Pat. No. 7,361,932.

(30) Foreign Application Priority Data

Sep. 29, 2005    (JP) .............................. 2005-284608

(51) Int. Cl.
  *H01L 21/84* (2006.01)
(52) U.S. Cl. ...................... 438/157; 438/142; 438/176; 257/E21.623; 257/E21.637
(58) Field of Classification Search ................ 438/142, 438/157, 176, 195, 199; 257/E21.623, E21.637
See application file for complete search history.

(56) References Cited

U.S. PATENT DOCUMENTS

| | | | |
|---|---|---|---|
| 4,786,611 A | 11/1988 | Pfiester | |
| 5,021,354 A * | 6/1991 | Pfiester | 438/230 |
| 5,607,868 A | 3/1997 | Chida et al. | |
| 5,633,523 A | 5/1997 | Kato | |
| 5,877,535 A | 3/1999 | Matsumoto | |
| 6,087,225 A | 7/2000 | Bronner et al. | |
| 6,110,782 A | 8/2000 | Chu et al. | |
| 6,432,776 B1 | 8/2002 | Ono | |
| 6,855,605 B2 | 2/2005 | Jurczak et al. | |

(Continued)

FOREIGN PATENT DOCUMENTS

JP    06-224379    8/1994

(Continued)

OTHER PUBLICATIONS

Japanese Office Action, issued in Japanese Patent Application No. 2005-284608, dated Mar. 23, 2010.

*Primary Examiner*—Asok K Sarkar
*Assistant Examiner*—Julia Slutsker
(74) *Attorney, Agent, or Firm*—McDermott Will & Emery LLP

(57) ABSTRACT

A semiconductor device of a dual-gate structure including a P-channel type field-effect transistor formed at a first region of a substrate and an N-channel type field-effect transistor formed at a second region of the substrate, includes a gate electrode including a polycrystalline silicon film continuously formed on the substrate to cover the first and second regions and a metal silicide film formed on the polycrystalline silicon film. The polycrystalline silicon film has a P-type part located on the first region and an N-type part coming into contact with the P-type part and located on the second region, and the P-type part is further doped with a heavier element than a P-type impurity that determines a conductivity type of the P-type part.

4 Claims, 7 Drawing Sheets

U.S. PATENT DOCUMENTS

2001/0046695 A1 11/2001 Lee et al.
2001/0049183 A1* 12/2001 Henson et al. .............. 438/479

FOREIGN PATENT DOCUMENTS

| JP | 2001-057391 | 2/2001 |
| JP | 2001-077210 | 3/2001 |
| JP | 2001-244346 | 9/2001 |
| JP | 2005-129615 | 5/2005 |

* cited by examiner

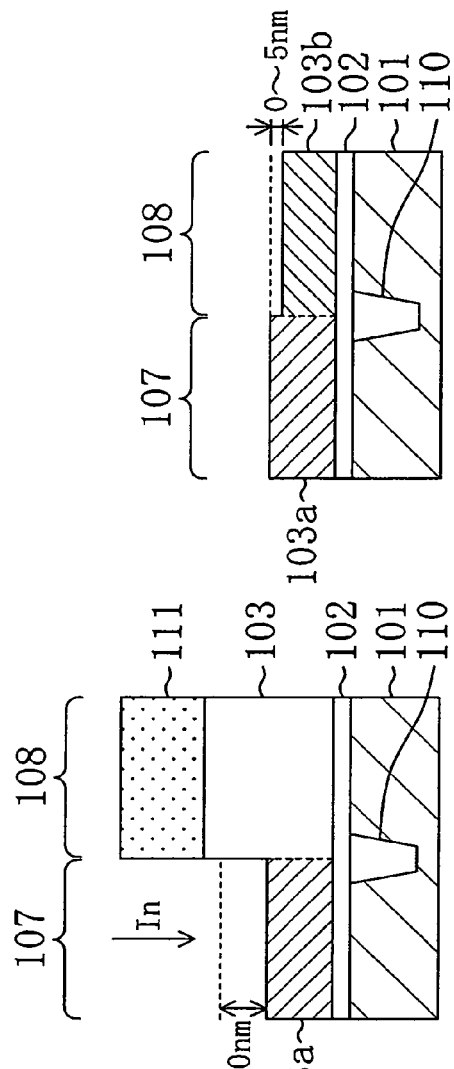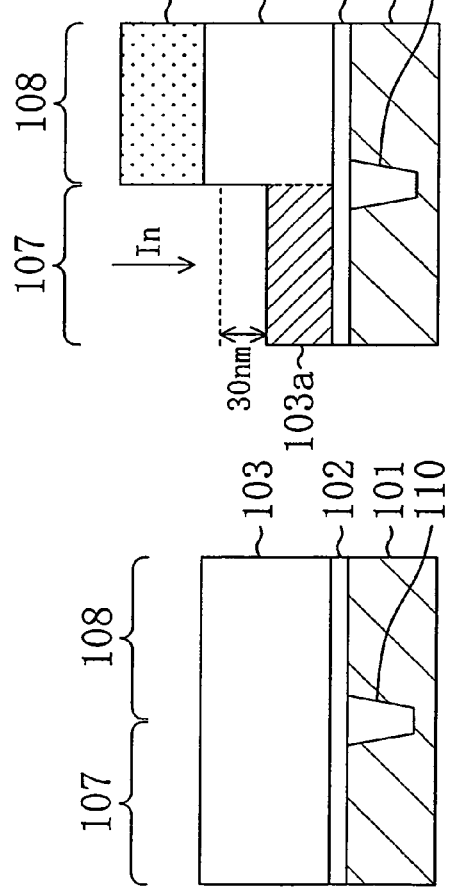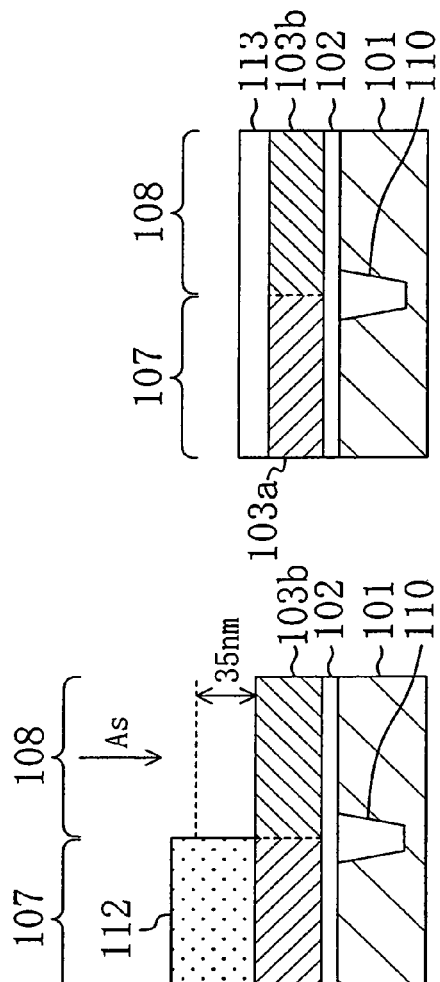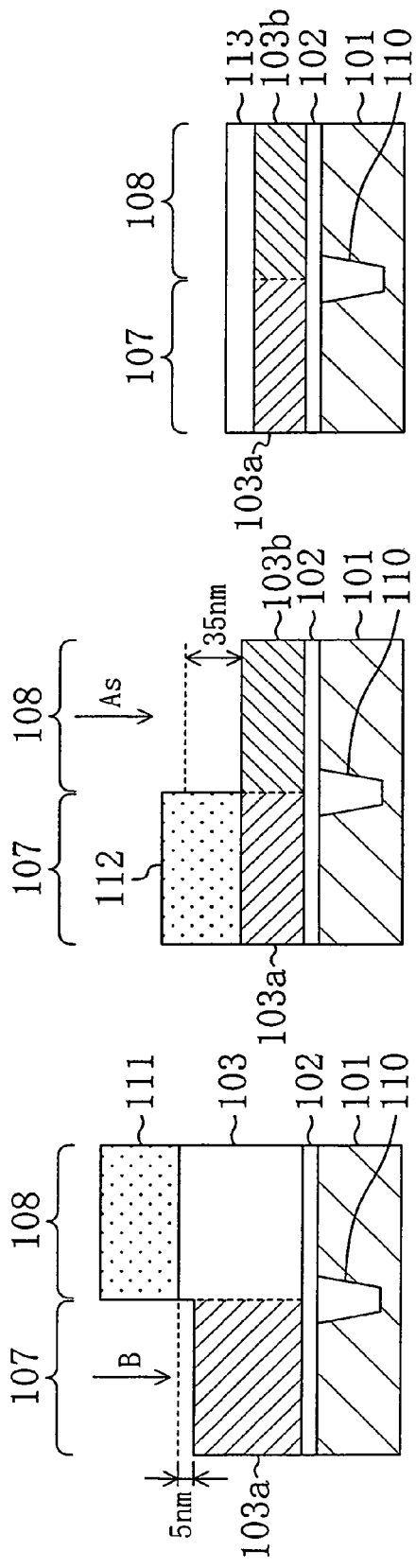

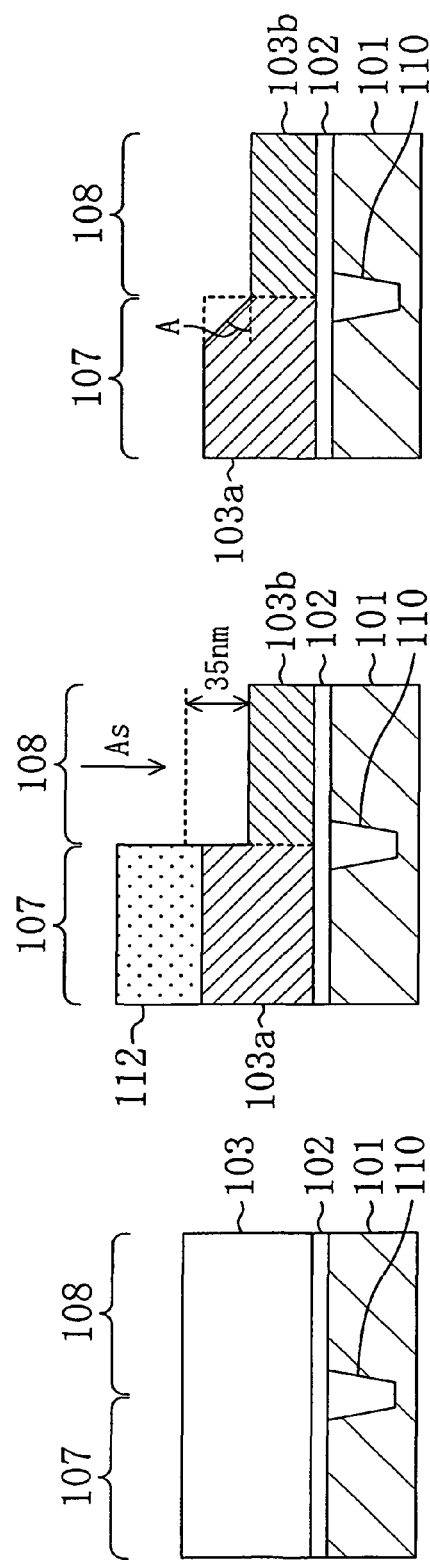

SEMICONDUCTOR DEVICE AND METHOD FOR FABRICATING THE SAME

RELATED APPLICATIONS

This application is a Divisional of U.S. application Ser. No. 11/474,391, filed Jun. 26, 2006, now U.S. Pat. No. 7,361,932, claiming priority of Japanese Application No. 2005-284608, filed Sep. 29, 2005, the entire contents of each of which are hereby incorporated by reference.

BACKGROUND OF THE INVENTION (1) Field of the Invention

The present invention relates to methods for fabricating semiconductor devices each having a silicided region, and more particularly relates to semiconductor devices containing nickel silicide and methods for fabricating the same.

(2) Description of Related Art

In recent years, with miniaturization of semiconductor devices, the minimum feature sizes of semiconductor devices have reached the deep submicron level, e.g., 50 nm. However, there have occurred, as one of factors that interfere with miniaturization of semiconductor devices, problems that interfere with an increase in performance of integrated circuits, such as a decrease in circuit speeds due to an increase in the resistance of a gate electrode caused by making the gate electrode finer. To cope with this, the following method is often used: The top surface of a polycrystalline polysilicon film forming part of a gate electrode of a field-effect transistor (FET) is subjected to metal silicidation for the purpose of suppressing an increase in the resistance of the gate electrode caused by making the gate electrode finer and thus the resistance of the gate electrode is reduced.

However, a metal silicide film becomes more likely to be broken due to silicide agglomeration with a reduction in its line width. It has been reported that in particular, in the case of a gate electrode having a dual-gate structure, a metal silicide film formed by siliciding a polycrystalline silicon film is increasingly likely to be broken at the PN junction of the polycrystalline silicon film. The dual-gate structure herein means a structure in which a single gate electrode has both a P-type part and an N-type part. Variations in the impurity concentration at the PN junction are considered as one of factors why a metal silicide film is likely to be broken at the PN junction of the polycrystalline silicon film.

In a case where a metal silicide film is broken at the PN junction, there occurs a serious problem that the resistance of a gate electrode is extremely increased when the PN junction is reverse-biased. To cope with this, there has been suggested a semiconductor device fabrication method for avoiding an increase in the resistance of a gate electrode due to such a broken film.

A schematic plan structure of a gate electrode illustrated in FIG. 7 is disclosed, for example, in Japanese Unexamined Patent Publication No. 2001-77210 (hereinafter, referred to as "Document 1"). In this structure, a part of a gate electrode located in the vicinity of the interface 13 between an N-type region 11 of a substrate and a P-type region 12 thereof has a larger width than the other part thereof. This restrains part of a metal silicide film from being broken at the PN junction.

Furthermore, another technique for restraining a metal silicide film from being broken at the PN junction is disclosed in Japanese Unexamined Patent Publication No. 2005-129615 (hereinafter, referred to as "Document 2"). This technique will be described with reference to FIGS. 8A through 8E.

First, as illustrated in FIG. 8A, a silicon substrate 21 is partitioned by its isolation region 22, and a gate insulating film 23 is formed on the top surface of the silicon substrate 21. Furthermore, a polycrystalline silicon film 24 is formed on the gate insulating film 23. Some of regions of the silicon substrate 21 defined by the isolation region 22 are represented as N-type FET regions 25 at which N-channel type field-effect transistors are formed, and the other ones of the regions are represented as P-type FET regions 26 at which P-channel type field effect transistors are formed.

Next, as illustrated in FIG. 8B, a resist 27 is formed on a part of a polycrystalline silicon film 24 located on the P-type FET region 26. Subsequently, phosphorus ions representing an N-type impurity are implanted into a part of the polycrystalline silicon film 24 located on the N-type FET region 25 using the resist 27 as a mask. Moreover, as illustrated in FIG. 8C, the resist 27 formed on the P-type FET region 26 is removed, and then a resist 28 is formed on the part of the polycrystalline silicon film 24 located on the N-type FET region 25. Subsequently, boron ions representing a P-type impurity are implanted into the part of the polycrystalline silicon film 24 located on the P-type FET region 26.

The conditions under which phosphorus and boron ions are implanted into the associated parts of the polycrystalline silicon film 24, respectively, are set such that the location at which the concentration of the implanted boron in the polycrystalline silicon film 24 reaches its peak becomes closer to the top surface of the silicon substrate 21 than the location at which the concentration of the implanted phosphorus therein reaches its peak. This prevents a PN junction 29 formed in the polycrystalline silicon film 24 from coinciding with the interface 29a between the top surface of a part of the polycrystalline silicon film 24 located on the P-type FET region 25 and the top surface of a part thereof located on the N-type FET region 26.

Thereafter, as illustrated in FIG. 8D, the resist 28 is removed, and then a metal film 30 of, for example, cobalt to be silicided is formed on the polycrystalline silicon film 24. Furthermore, as illustrated in FIG. 8E, a silicide film 31 is formed by heat treatment.

In this case, the silicide film 31 is likely to be broken at the location in which the interface 29a exists. However, it will be broken apart from the PN junction 29. This can suppress a significant increase in the resistance of the gate electrode.

SUMMARY OF THE INVENTION

However, the above-mentioned two known techniques have the following drawbacks.

First, for the technique disclosed in Document 1, the width of a part of the gate electrode 14 located in the vicinity of the interface 13 is increased to prevent breaks. The interconnect pitch of a gate electrode is substantially determined based on the width of the part of the gate electrode 14 located in the vicinity of the interface 13. This inhibits an increase in the degree of integration of semiconductor devices.

For the technique disclosed in Document 2, a significant increase in the resistance of a gate electrode is avoided by preventing the location of the PN junction 29 from coinciding with a broken part of the silicide film 31. However, the occurrence of a break in the silicide film 31 itself is not resolved. The resistance of the gate electrode can never cease from being increased. It is considered that in a case where semiconductor devices are further miniaturized in the future, even a slight increase in the resistance as described above may exert a critical influence on circuit operations.

In view of the above, it has been a problem to suppress breaks in silicide at the PN junction without the above-mentioned drawbacks.

In view of the above-described problem, it is an object of the present invention to provide a semiconductor device that can suppress breaks in a metal silicide film containing an impurity at the PN junction without increasing the widths of interconnects, such as gate electrodes, partly formed of the metal silicide film and a fabrication method for the same.

The present inventor conducted a detailed survey about the interface between the P-type FET region and the N-type FET region. As a result, the following was discovered.

First, it was found that in an ion implantation step for forming source and drain regions in the formation of a FET, a part of a polycrystalline silicon film located on a P-type FET region and forming part of a gate electrode has a different thickness from a part thereof located on an N-type FET region and forming part of a gate electrode due to the difference in the amount of the polycrystalline silicon film removed by the ion implantation between the P-type FET region and the N-type FET region. For example, in a case where boron and at least one of phosphorus and arsenic are used as a P-type impurity and an N-type impurity, respectively, a part of the doped polycrystalline silicon film located on the N-type FET region is 25 nm or more thinner than a part thereof located on the P-type FET region.

In order to individually introduce P-type and N-type impurities into the polycrystalline silicon film, resist masks are usually provided. The resist masks are removed, for example, using a mixed solution of sulfuric acid and hydrogen peroxide solution or a mixed solution of an ammonia solution and a hydrogen peroxide solution after the ion implantation. It was recognized that in the step of removing the resist masks as described above, a part of a gate electrode obtained by introducing the N-type impurity into the polycrystalline silicon film is further reduced in thickness by approximately 0 through 5 nm.

In view of the above, it was found that after the formation of source and drain regions, an N-type gate electrode becomes approximately 30 nm thinner than a P-type gate electrode and the top surface of part of the polycrystalline silicon film at the interface between the N-type FET region and the P-type FET region is formed with a step.

Conducted was an experiment in which the top surface of the polycrystalline silicon film is intentionally formed with a step and then silicided. As a result, it was discovered that the height of the step of the polycrystalline silicon film and the shape thereof are significantly correlated with breaks in silicide. Furthermore, it was discovered that in particular, when the step height is three times or more as large as the thickness of a metal film formed so as to be silicided, the silicided metal film becomes increasingly likely to be broken. The reason for this is considered as follows: The metal film for forming a metal silicide film is less evenly covered with the polycrystalline silicon film at the location where the step is formed. Furthermore, it was also found that also when the height of the step is twice or more as large as the thickness of the resultant metal silicide film, the metal silicide film becomes likely to be broken.

The present invention is made based on the above-mentioned new findings.

To be specific, a semiconductor device of a dual-gate structure according to a first aspect of the present invention including a P-channel type field-effect transistor formed on a first region of a substrate and an N-channel type field-effect transistor formed at a second region of the substrate includes a gate electrode including a polycrystalline silicon film continuously formed on the substrate to cover the first and second regions and a metal silicide film formed on the polycrystalline silicon film, wherein the polycrystalline silicon film has a P-type part located on the first region and an N-type part coming into contact with the P-type part and located on the second region, and the P-type part is further doped with a heavier element than a P-type impurity that determines a conductivity type of the P-type part.

According to the semiconductor device of the first aspect, the P-type part is further doped with a heavier element than the P-type impurity, thereby reducing the height of a step with which the top surface of the polycrystalline silicon film is formed. This restrains silicide formed on the polycrystalline silicon film from being broken. This will be described below.

As previously described, when the top surface of the gate electrode partly formed of the polycrystalline silicon film is formed with a step, silicide is likely to be broken at the location of the step. This was discovered by the present inventor. For the known semiconductor device, the P-type part of the polycrystalline silicon film into which a P-type impurity has been implanted is thicker than the N-type part thereof into which an N-type impurity has been implanted due to the difference in the amount of the polycrystalline silicon film removed by the ion implantation between the P-type part and the N-type part.

On the other hand, for the semiconductor device of the first aspect, a heavier element than the P-type impurity is implanted into a part of the polycrystalline silicon film located on the first region, thereby cutting away part of the polycrystalline silicon film and reducing the thickness of the P-type part. This reduces the difference in thickness between the P-type part and the N-type part and also reduces the height of the step located at the interface between the P-type part and the N-type part. As a result, a silicide film is restrained from being broken.

The difference in thickness between the P-type part and the N-type part is preferably equal to or smaller than twice the thickness of the metal silicide film.

When the height of the step formed due to the difference in the thickness between parts of the gate electrode is small enough, this restrains the metal silicide film formed as part of the gate electrode from being broken. This effect noticeably becomes evident when the height of the step (the difference in thickness between the P-type part and the N-type part) is equal to or smaller than twice the thickness of the metal silicide film. Therefore, the height of the step should be equal to or smaller than twice the thickness of the metal silicide film. Furthermore, the thicknesses of the P-type part and the N-type part of the polycrystalline silicon film may be equal to each other and no step may exist even at the interface between the P-type part and the N-type part. This is preferable.

A semiconductor device of a dual-gate structure according to a second aspect of the present invention including a P-channel type field-effect transistor formed at a first region of a substrate and an N-channel type field-effect transistor formed at a second region of the substrate includes a gate electrode including a polycrystalline silicon film continuously formed on the substrate to cover the first and second regions and a metal silicide film formed on the polycrystalline silicon film, wherein the polycrystalline silicon film has a P-type part located on the first region and an N-type part coming into contact with the P-type part and located on the second region, and part of the polycrystalline silicon film located at the interface between the P-type part and the N-type part is further doped with a heavier element than a P-type impurity that determines a conductivity type of the P-type part.

According to the semiconductor device of the second aspect, part of the polycrystalline silicon film located at the interface between the P-type part and the N-type part is further doped with a heavier element than a P-type impurity. In this way, a step formed at the above-mentioned interface due to the difference in thickness between the P-type part and the N-type part is smoothed or removed. This restrains the metal silicide film from being broken.

The possibility that the metal silicide film may be broken after the formation of the metal silicide film on the polycrystalline silicon film depends on not only the height of the step with which the top surface of the polycrystalline silicon film is formed but also the shape of the step. It was found that in particular, in a case where the step extends upward at a steep angle or is inversely tapered, a part of the metal silicide film located on a thinner part of the polycrystalline silicon film than the other part thereof is likely to be broken in the vicinity of the interface between the thinner part and the other part. The reason for this is considered that when the metal film is formed on the polycrystalline silicon film, the metal film is less likely to cover the polycrystalline silicon film at such a location (for example, the metal film becomes thinner, and alternatively part of the polycrystalline silicon film is not covered with the metal film). On the other hand, when like the semiconductor device of the second aspect, the step is cut away by implanting a heavier element than the P-type impurity into the step and thus the metal film has a shape that allows the metal film to evenly cover the polycrystalline silicon film, this restrains the metal film from being broken after the silicidation of the metal film.

It is preferable that the top surface of part of the polycrystalline silicon film including said interface is continuously formed. When the top surface of part of the polycrystalline silicon located at the interface is thus smoothed, this noticeably restrains the metal silicide film from being broken.

The heavier element than the P-type impurity is preferably at least one of gallium, indium, arsenic, antimony, argon, and krypton.

The implantation of ions of such an element can certainly reduce the thickness of the polycrystalline silicon film. However, in addition to the above-mentioned elements, any other element that permits reliable removal of part of the polycrystalline silicon film to reduce the thickness thereof and can be used for ion implantation can be used as the heavier element than the P-type impurity.

A semiconductor device of a dual-gate structure according to a third aspect of the present invention including a P-channel type field-effect transistor formed at a first region of a substrate and an N-channel type field-effect transistor formed at a second region of the substrate includes a gate electrode including a polycrystalline silicon film continuously formed on the substrate to cover the first and second regions and a metal silicide film formed on the polycrystalline silicon film, wherein the polycrystalline silicon film has a P-type part located on the first region and an N-type part coming into contact with the P-type part and located on the second region, the P-type part is thicker than the N-type part, and an end part of the P-type part located above the N-type part and at the interface between the P-type part and the N-type part of the polycrystalline silicon film is normally tapered.

According to the semiconductor device of the third aspect, the step formed in the top surface of part of the polycrystalline silicon film located at the interface between the P-type part and the N-type part is normally tapered. This restrains the metal silicide film from being broken at the step.

As previously described, in a case where the step extends upward at a steep angle or is inversely tapered, a part of the metal silicide film located on a thinner part of the polycrystalline silicon film than the other part thereof is likely to be broken in the vicinity of the interface between the thinner part and the other part. On the other hand, in the semiconductor device of the third aspect, the P-type part of the polycrystalline silicon film is thicker than the N-type part thereof, and an end part of the P-type part located above the N-type part is normally tapered. This restrains the metal silicide film from being broken.

The taper angle of the normally tapered end part is preferably 40 through 60 degrees both inclusive.

The taper angle of the normally tapered end part herein represents the angle of the step from the top surface of a thinner region of the polycrystalline silicon film than the other region thereof. When this angle is 40 through 60 degrees both inclusive, this can restrain the metal film to be silicided from unevenly covering the polycrystalline silicon film. This can certainly prevent the metal silicide film from being broken.

A method for fabricating a semiconductor device of a dual-gate structure according to a fourth aspect of the present invention includes a P-channel type field-effect transistor formed at a first region of a substrate and an N-channel type field-effect transistor formed at a second region of the substrate. The method includes the steps of: continuously forming a polycrystalline silicon film on the substrate to cover the first and second regions; implanting a P-type impurity into a part of the polycrystalline silicon film located on the first region, thereby forming a P-type part; implanting an N-type impurity into a part of the polycrystalline silicon film located on the second region and coming into contact with the P-type part, thereby forming an N-type part; forming a metal film on the polycrystalline silicon film; and forming a metal silicide film by siliciding the metal film, wherein the difference in thickness between the P-type part and the N-type part is produced by the implantation of the P-type impurity and the implantation of the N-type impurity, and said method further includes the step of reducing the difference in thickness before the step of forming the metal film.

The P-type and N-type parts of the polycrystalline silicon film often have different thicknesses, because different impurities (a P-type impurity and an N-type impurity) are implanted into the P-type and N-type parts. In such a case where the P-type and N-type parts of the gate electrode have different thicknesses and the level difference exists at the interface between the P-type part and the N-type part, the metal silicide film is likely to be broken after the formation of the metal silicide film on the polycrystalline silicon film. The reason for this is that when the metal film is formed on the polycrystalline silicon film, the metal film is likely to unevenly cover the step.

The level difference at the interface is reduced by reducing the difference in thickness between the P-type part of the polycrystalline silicon film and the N-type part thereof. This can restrain the metal silicide film from being broken. As a result, a semiconductor device can be fabricated which suppresses a break in the metal silicide film.

The difference in thickness between the P-type part and the N-type part is preferably equal to or smaller than twice the thickness of the metal film.

This ensures that the step of the polycrystalline silicon film is also covered with the metal film. Therefore, the metal silicide film is certainly restrained from being broken.

It is preferable that in the step of reducing the difference in thickness, the P-type part is further doped with a heavier element than the P-type impurity, thereby reducing the thickness of the P-type part.

The P-type part into which a P-type impurity is implanted usually becomes thicker than the N-type part. To cope with this, the thickness of the P-type part is reduced by implanting a heavier element than a P-type impurity into the P-type part. This can reduce the difference in thickness between the P-type part and the N-type part. This can certainly suppress a break in the metal silicide film.

A method for fabricating a semiconductor device of a dual-gate structure according to a fifth aspect of the present invention includes a P-channel type field-effect transistor formed at a first region of a substrate and an N-channel type field-effect transistor formed at a second region of the substrate. The method includes the steps of: continuously forming a polycrystalline silicon film on the substrate to cover the first and second regions; implanting a P-type impurity into a part of the polycrystalline silicon film located on the first region, thereby forming a P-type part; implanting an N-type impurity into a part of the polycrystalline silicon film located on the second region and coming into contact with the P-type part, thereby forming an N-type part; forming a metal film on the polycrystalline silicon film; and forming a metal silicide film by siliciding the metal film, wherein the difference in thickness between the P-type part and the N-type part is produced by the implantation of the P-type impurity and the implantation of the N-type impurity, and said method further comprises the step of removing a step of the polycrystalline silicon film formed at the interface between the P-type part and the N-type part due to the difference in thickness before the step of forming the metal silicide film.

According to the method of the fifth aspect, a semiconductor device can be fabricated which suppresses a break in the metal silicide film. The reason for this is as follows.

As previously described, the step of the polycrystalline silicon film formed in the top surface thereof and at the interface between the P-type part and the N-type part causes a break in the metal silicide film. To cope with this, the step is eliminated or smoothed by removing part of the upper part of the polycrystalline silicon film located at the interface between the P-type part and the N-type part. This can restrain the metal silicide film from being broken. The reason for this is that the metal film to be silicided is allowed to evenly cover the polycrystalline silicon film by eliminating or smoothing the step.

In the step of removing the step, the step is preferably doped with a heavier element than the P-type impurity.

A heavier element than the P-type impurity is implanted into the step and the upper part of the polycrystalline silicon film is partly removed, thereby cutting away the step. Since the step formed at the interface is thus removed or smoothed, this allows the metal film to evenly cover the polycrystalline silicon film. As a result, the metal silicide film is restrained from being broken.

The heavier element than the P-type impurity is at least one of gallium, indium, arsenic, antimony, argon, and krypton.

The implantation of ions of such an element can certainly reduce the thickness of the polycrystalline silicon film. However, in addition to the above-mentioned elements, any other element that permits reliable removal of part of the polycrystalline silicon film to reduce the thickness thereof and can be used for ion implantation can be used as the heavier element than the P-type impurity. When an element that can serve as a P-type impurity or an N-type impurity is used, it can function as an impurity of the corresponding conductivity type. Alternatively, the use of an element that can be an impurity having no charge can reduce the thickness of the polycrystalline silicon film without affecting the conductivity type of a region thereof into which the element is implanted.

Next, a method for fabricating a semiconductor device of a dual-gate structure according to a sixth aspect of the present invention includes a P-channel type field-effect transistor formed at a first region of a substrate and an N-channel type field-effect transistor formed at a second region of the substrate. The method includes the steps of: continuously forming a polycrystalline silicon film on the substrate to cover the first and second regions; implanting a P-type impurity into a part of the polycrystalline silicon film located on the first region, thereby forming a P-type part; implanting an N-type impurity into a part of the polycrystalline silicon film located on the second region and coming into contact with the P-type part, thereby forming an N-type part; forming a metal film on the polycrystalline silicon film; and forming a metal silicide film by siliciding the metal film, wherein the difference in thickness between the P-type part and the N-type part is produced by the implantation of the P-type impurity and the implantation of the N-type impurity, and said method further comprises the step of normally tapering an end part of the P-type part located above the N-type part and at the interface between the P-type part and the N-type part of the polycrystalline silicon film.

According to the method of the sixth aspect, an end part of the P-type part located above the N-type part is normally tapered at the interface between the P-type part and the N-type part of the polycrystalline silicon film. This ensures that the end part of the P-type part is covered with the metal film. Therefore, the metal silicide film formed by siliciding the metal film can be restrained from being broken.

It is preferable that the end part is normally tapered by selective etching. Furthermore, it is preferable that this etching is dry etching using a mixed gas of $CF_4$ and $O_2$ or an Ar gas.

Thus, an end part of a thicker region of the polycrystalline silicon film than the other region thereof is partly removed so as to be certainly tapered at the step. This can surely restrain the metal silicide film from being broken.

According to the semiconductor device of the present invention and the fabrication method for the same, a metal silicide film can be restrained from being broken at the PN junction of a silicide interconnect, such as a gate electrode configured such that the metal silicide film is formed on a polycrystalline silicon film. This can restrain the metal silicide film from being electrically broken and avoids an increase in the resistance of the interconnect. In view of the above, the resistance of the interconnect can be restrained from being increased due to a break in the metal silicide film at the PN junction without increasing the line width (the width of the gate electrode) and thus interfering with an increase in the degree of integration. This can prevent a malfunction in an integrated circuit. In view of the above, the present invention is useful for a semiconductor device of a dual-gate structure having a silicide film.

BRIEF DESCRIPTION OF THE DRAWINGS

FIGS. 2A through 2F are diagrams for explaining process steps for fabricating a semiconductor device according to a first embodiment.

FIG. 5A through 5F are diagrams for explaining process steps for fabricating a semiconductor device according to a second embodiment of the present invention.

DETAILED DESCRIPTION OF THE INVENTION

Embodiment 1

A semiconductor device according to a first embodiment of the present invention and a fabrication method for the same will be described hereinafter with reference to the drawings.

Figure 1:
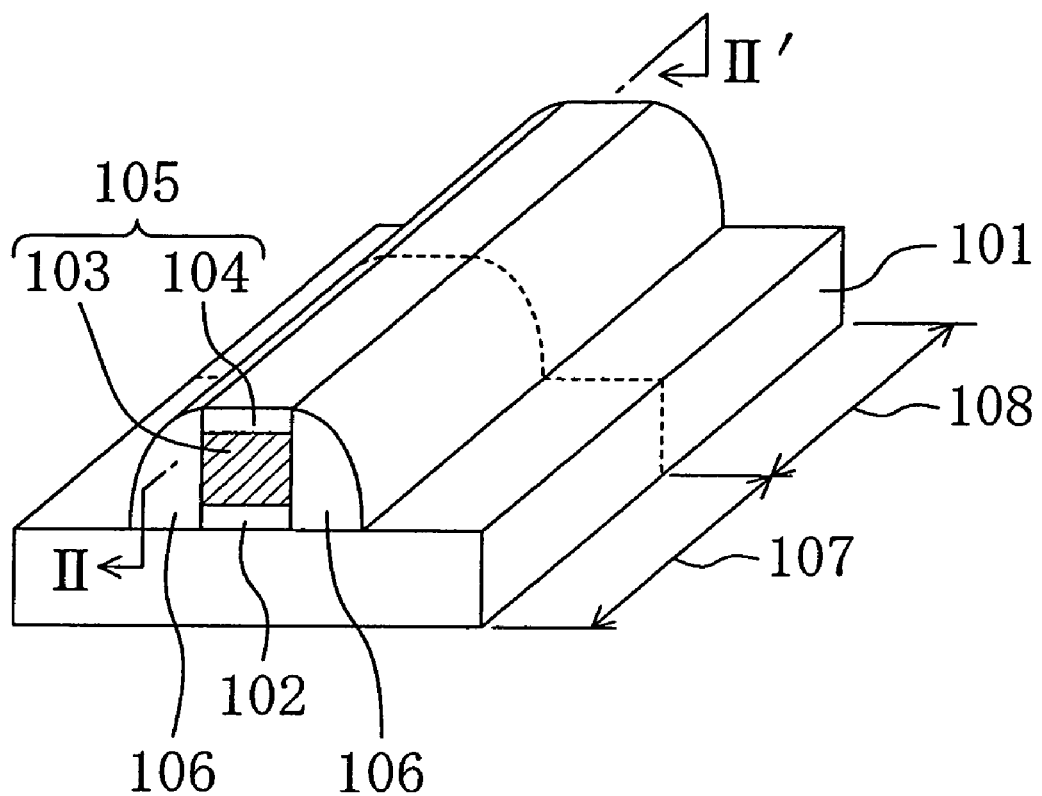
FIG. 1 is a diagram illustrating a field-effect transistor with which a semiconductor device according to each of embodiments of the present invention is provided.

First, FIG. 1 schematically illustrates a field-effect transistor of a dual-gate structure with which the semiconductor device of the present invention is provided. The field-effect transistor is formed at a semiconductor substrate 101 and includes a gate oxide film 102 formed as an insulating film on the semiconductor substrate 101 and a gate electrode 105 composed of a polycrystalline silicon film 103 formed on the gate oxide film 102 and a metal silicide film 104 formed on the polycrystalline silicon film 103. Sidewalls 106 are formed on both sides of the gate electrode 105 with the gate electrode 105 interposed therebetween.

Furthermore, the semiconductor substrate 101 has a first region 107 at which a P-channel type transistor is formed and a second region 108 which comes into contact with the first region 107 and at which an N-channel type transistor is formed.

The semiconductor substrate 101 also includes source and drain regions. The source and drain regions are formed in the semiconductor substrate 101 with the gate electrode 105 interposed therebetween when seen in plan. Furthermore, the semiconductor substrate 101 is partitioned by its isolation region. The source and drain regions and the isolation region are not illustrated.

Next, FIGS. 2A through 2F are diagrams for explaining process steps for fabricating the field-effect transistor with which the semiconductor device of this embodiment is provided. These figures each illustrate a cross section of the field-effect transistor taken longitudinally to a gate electrode thereof and perpendicularly to a substrate 101, that is, taken along the line II-II' in FIG. 1.

FIG. 2A illustrates the state of the semiconductor device just after the formation of a polycrystalline silicon film 103 forming part of a gate electrode 105. First, before the formation of the polycrystalline silicon film 103, an isolation region 110 is formed in a semiconductor substrate 101 by a known method, and necessary ions for devices are implanted into the semiconductor substrate 101 to control the threshold voltage. Next, a gate oxide film 102 is formed on the semiconductor substrate 101, and then a polycrystalline silicon film 103 is formed on the gate oxide film 102. Thereafter, although not illustrated in FIG. 2A, sidewalls 106 are formed on both sides of the polycrystalline silicon film 103 with the polycrystalline silicon film 103 interposed therebetween as illustrated in FIG. 1. The polycrystalline silicon film 103 has a thickness of, for example, 150 nm.

Next, as illustrated in FIG. 2B, a resist 111 is patterned on a part of the polycrystalline silicon film 103 located on a second region 108 of the semiconductor substrate 101, and boron ($B^+$) ions representing a P-type impurity are implanted into a part of the polycrystalline silicon film 103 located on a first region 107 of the semiconductor substrate 101 using the resist 111 as a mask, for example, at an implantation energy of approximately 3 keV and a dose of $3\times10^2/cm^2$. In this way, a P-type part 103a of the polycrystalline silicon film 103 is formed. The above-described ion implantation for forming the P-type part 103a reduces the thickness of the part of the polycrystalline silicon film 103 located on the first region 107 by approximately 5 nm.

Subsequently, as illustrated in FIG. 2C, likewise, indium ions are implanted into the P-type part 103a (the part of the polycrystalline silicon film 103 located on the first region 107) using the resist 111 as a mask, for example, at an implantation energy of approximately 30 keV and a dose of $5\times10^{14}/cm^2$.

This ion implantation reduces the thickness of the P-type part 103a by approximately 30 nm. Thereafter, the resist 111 is removed by a usual method. This removal of the resist 111 is achieved, for example, by subjecting the resist 111 to ashing using a usual method and then cleaning the substrate region using a mixed solution of sulfuric acid and hydrogen peroxide solution or a mixed solution of an ammonia solution and a hydrogen peroxide solution. Both of the two mixed solutions may be used for this cleaning process.

Next, as illustrated in FIG. 2D, a resist 112 is patterned on a part of the polycrystalline silicon film 103 located on the first region 107, and arsenic (As) ions representing an N-type impurity are implanted into a part of the polycrystalline silicon film 103 located on the second region 108 using the resist 112 as a mask, for example, at an implantation energy of approximately 20 keV and a dose of $5\times10^2/cm^2$. In this way, an N-type part 103b of the polycrystalline silicon film 103 is formed.

The above-described ion implantation for forming the N-type part 103b reduces the thickness of the part of the polycrystalline silicon film 103 located on the second region 108 by approximately 35 nm. Thereafter, the resist 112 is removed by a usual method. In this case, the part of the polycrystalline silicon film 103 located on the second region 108 (i.e., the N-type part 103b) is reduced in thickness by approximately 0 through 5 nm.

Consequently, as illustrated in FIG. 2E, the difference in thickness between the P-type part 103a into which a P-type impurity has been implanted and the N-type part 103b into which an N-type impurity has been implanted becomes approximately 0 through 5 nm. Thereafter, the substrate region is subjected to heat treatment for activating the implanted ions at a temperature of 1050° C. for several seconds.

Subsequently, as illustrated in FIG. 2F, a 10-nm-thick nickel film 113 for forming a silicide film is formed to cover the P-type part 103a and the N-type part 103b. Thereafter, the substrate region is subjected to heat treatment, thereby causing a reaction between nickel forming the nickel film 113 and silicon forming both the P-type part 103a and the N-type part 103b (i.e., the polycrystalline silicon film 103). In this manner, a nickel silicide film (not shown) is formed.

According to the above-mentioned method, as illustrated in FIG. 2E, the difference in thickness between the P-type part 103a and the N-type part 103b (the difference in thickness between the part of the polycrystalline silicon film 103 located on the first region 107 and the part thereof located on the second region 108) can be approximately 0 through 5 nm. As a result, when the nickel film 113 is formed on the polycrystalline silicon film 103, a step of the polycrystalline silicon film 103 is also covered with the nickel film 113 with reliability. For this reason, when a nickel silicide film is formed by siliciding the nickel film 113, any break in the nickel silicide film does not occur. In this manner, a semiconductor device can be fabricated which suppresses a break in the silicide film and an increase in the resistance of its gate electrode.

The height of the step of the polycrystalline silicon film 103 and the possibility that the nickel silicide film may be broken will be described hereinafter.

Figure 3A:
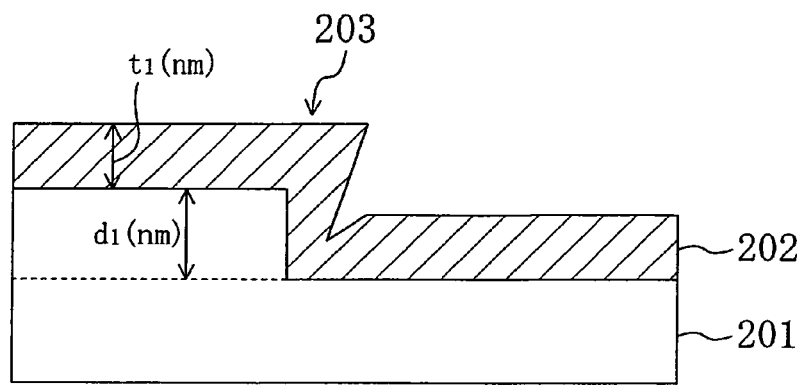
FIG. 3A is a diagram illustrating how a metal film to be silicided is formed on a substrate having a step.

First, FIG. 3A illustrates how a metal film 202 is formed on the entire surface of a substrate 201 whose top surface is formed with a step 203. The metal film 202 is to be silicided so as to be formed into a nickel silicide film. The step 203 has a height of $d_1$ nm, and most part of the metal film 202 except for part thereof located at the step has a uniform thickness of $t_1$ nm.

As illustrated in FIG. 3A, the step 203 makes it difficult to cover the entire surface of the substrate 201 with the metal film 202. More particularly, the metal film 202 is likely to become thin, and it is also considered that in some cases, a hole may pass through the metal film 202 to expose part of the substrate 201. This causes that the metal silicide film is broken after the silicidation of the metal film 202.

Figure 3B:
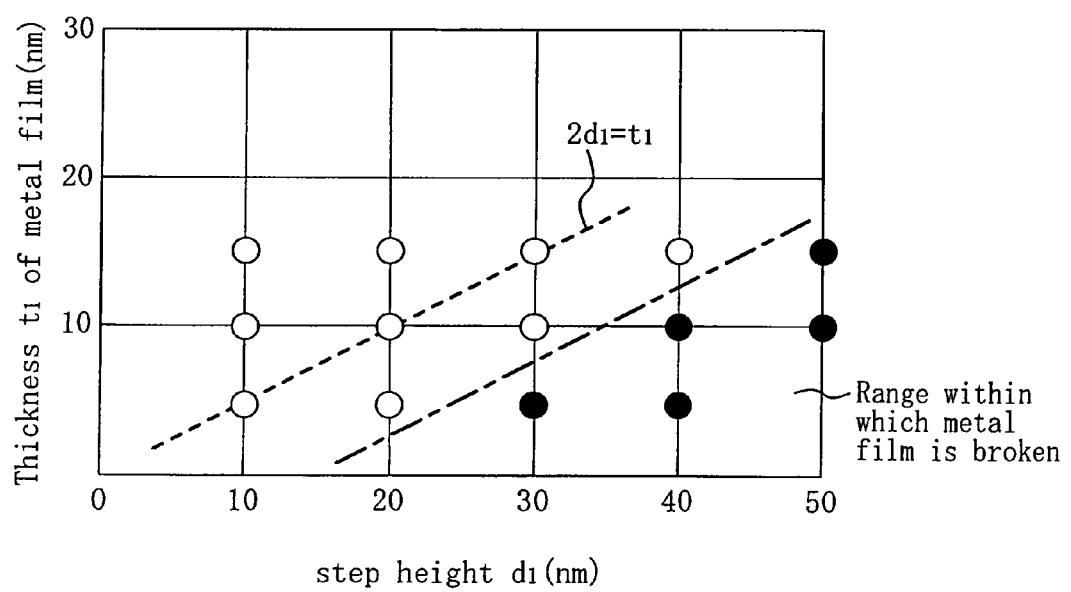
FIG. 3B is a diagram illustrating the relationship between a combination of the height of the step and the thickness of the metal film and a break in a metal silicide film.

FIG. 3B illustrates the relationship between a combination of the height $d_1$ of the step 203 and the thickness $t_1$ of the metal film 202 and a break in a metal silicide film after the silicidation of the metal film 202. In FIG. 3B, in a case where $d_1$ and $t_1$ are values illustrated by white circles, the metal silicide film is not broken even after the silicidation of the metal film 202. On the other hand, in a case where $d_1$ and $t_1$ are values illustrated by black circles, the metal silicide film is broken after silicidation of the metal film 202.

It is considered based on the above-described results that in a case where the height $d_1$ of the step 203 is approximately three or more times larger than the thickness $t_1$ of the metal film 202, the metal silicide film is likely to be broken. In view of the above, when $d_1$ is reduced to a value that is equal to or smaller than twice the thickness $t_1$, this can certainly suppress a break in the silicide film.

Figure 4A:
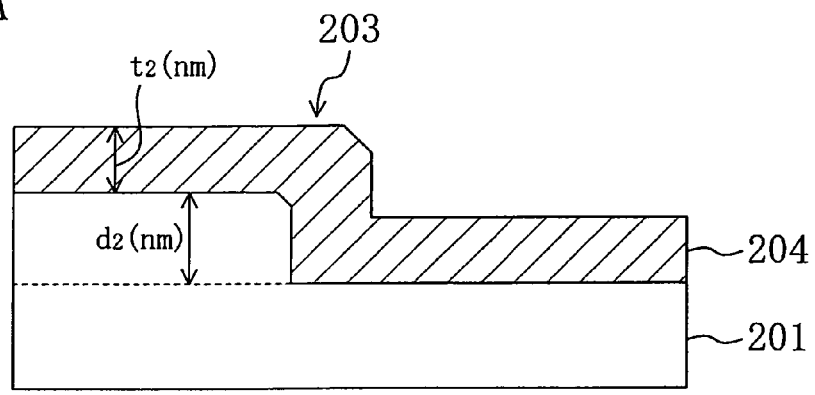
FIG. 4A is a diagram illustrating how a metal silicide film is formed on a substrate having a step.

FIG. 4A illustrates how a metal silicide film 204 is formed on a substrate 201 whose top surface is formed with a step 203. In other words, it illustrates the state of the semiconductor device after the metal film 202 illustrated in FIG. 3A is silicided. The step 203 has a height of $d_2$ nm and most part of the metal silicide film 204 except for part thereof located at the step has a uniform thickness of $t_2$ nm.

Figure 4B:
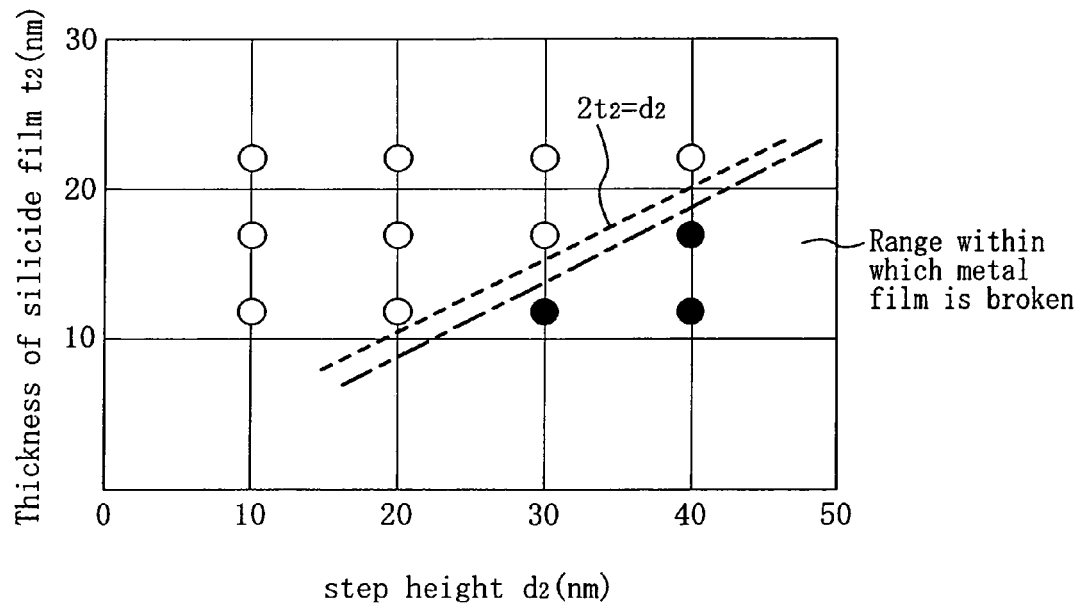
FIG. 4B is a diagram illustrating the relationship between a combination of the height of the step and the thickness of the metal silicide film and a break in the metal silicide film.

Furthermore, FIG. 4B illustrates the relationship between a combination of the height $d_2$ of the step 203 and the thickness $t_2$ of the metal silicide film 204 and a break in a metal silicide film 204. In FIG. 4B, in a case where $d_2$ and $t_2$ are values illustrated by white circles, the metal silicide film 204 is not broken. On the other hand, in a case where $d_2$ and $t_2$ are values illustrated by black circles, the metal silicide film 204 is broken.

It is considered based on the above-described results that when the height $d_2$ of the step 203 is reduced to a value that is equal to or smaller than twice the thickness $t_2$ of the metal silicide film 204, this can certainly suppress a break in the metal silicide film 204.

In this embodiment, indium ions are implanted into a part of a polycrystalline silicon film 103 located on a first region 107 of a semiconductor substrate 101 so that the part thereof is partly removed, thereby reducing the thickness of the part. However, any implantable element that is heavier than a P-type impurity and allows removal of part of the polycrystalline silicon film may be used for the above-described ion implantation. Ions to be implanted into the part of the polycrystalline silicon film are not limited to indium ions. To be specific, for example, gallium, arsenic, antimony, argon, krypton, or any other element can be used.

In this embodiment, immediately after annealing for activating the implanted ions, a metal film (nickel film 113) for siliciding the polycrystalline silicon film 103 is formed. However, in order to provide a region of the polycrystalline silicon film 103 that is not to be silicided, a resist may be patterned on the region of the polycrystalline silicon film 103 that is not to be silicided after an oxide film or a nitride film is formed on the polycrystalline silicon film 103. Thereafter, a part of the previously formed oxide film or nitride film located in a region of polycrystalline silicon film 103 on which the resist is not formed and which is to be silicided is removed, and further the resist is also removed. Thereafter, a metal film is formed and further silicided.

Embodiment 2

A semiconductor device according to a second embodiment of the present invention and a fabrication method for the same will be described hereinafter with reference to the drawings.

A field-effect transistor of a dual-gate structure with which the semiconductor device of the present invention is provided also has the same structure as schematically illustrated in FIG. 1. The field-effect transistor of this embodiment is the same as that of the first embodiment, and therefore its detailed description is not given.

Next, FIGS. 5A through 5F are diagrams for explaining process steps for fabricating the field-effect transistor with which the semiconductor device of this embodiment is provided. Like the first embodiment, these figures are also cross-sectional views taken along the line II-II' in FIG. 1. Process steps illustrated in FIGS. 5A and 5B are the same as those described in the first embodiment with reference to FIGS. 2A and 2B. Therefore, in this embodiment, the same reference numerals are given to the same components as in FIGS. 2A and 2B, and therefore a description thereof is not given. In the process steps illustrated in FIGS. 5A and 5B, a P-type part 103a is formed in a polycrystalline silicon film 103 forming part of a gate electrode by implantation of boron ($B^+$) ions representing a P-type impurity into a part of a polycrystalline silicon film 103 located on a first region 107 of a substrate. Furthermore, the top surface of the P-type part 103a is cut away so as to be reduced in thickness by approximately 5 nm.

Next, a resist 111 is removed, and then as illustrated in FIG. 5C, a resist 112 is formed on the part of the polycrystalline silicon film 103 located on the first region 107. Subsequently, arsenic (As) ions representing an N-type impurity are implanted into a part of the polycrystalline silicon film 103 located on a second region 108 of the substrate using the resist 112 as a mask, for example, at an implantation energy of approximately 20 keV and a dose of $5 \times 10^2/cm^2$.

This ion implantation allows the part of the polycrystalline silicon film 103 located on the second region 108 to be formed into an N-type part 103b, and the top surface of the N-type part 103b is cut away so as to be reduced in thickness by approximately 35 nm. Thereafter, the resist 112 is removed by a usual method. In this case, the top surface of the N-type part 103b is cut away so as to be reduced in thickness by approximately 0 through 5 nm.

In view of the above, as illustrated in FIG. 5D, the difference in thickness between the P-type part 103a into which a P-type impurity has been implanted and the N-type part 103b into which an N-type impurity has been implanted is 30 nm or more. Thus, the top surface of part of the polycrystalline silicon film 103 located at the interface between the first region 107 and the second region 108 is formed with a step 121. Thereafter, the substrate region is subjected to heat treatment for activating the implanted ions at a temperature of 1050° C. for several seconds.

Next, a corner portion of the step 121 is removed by etching so that an end part thereof is normally tapered. In order to achieve this, plasmas are applied to the substrate region at a substrate temperature of 100° C. for ten seconds by applying a power of 3 kW from a 13.56 MHz RF power source to, for example, a mixed gas of $CF_4$ at a flow rate of 3 sccm and $O_2$ at a flow rate of 30 sccm. Herein, sccm represents a unit of flow rate calculated in terms of volumes at a temperature of 0° C. and one atmospheric pressure and expressed in milliliters per minute.

As illustrated in FIG. 5E, the corner portion of the step 121 is etched by the above-mentioned etching process. In this way, the step 121 is tapered. Herein, a taper angle A becomes approximately 43 degrees. Herein, the taper angle A means an angle of a tapered part of the P-type part 103a from the top surface of a part of the polycrystalline silicon film 103 located on the second region 108 and having a smaller thickness than a part thereof located on the first region 107.

Thereafter, after the substrate region is cleaned by a usual method, a nickel film 113 is formed, as a metal film to be silicided, on the polycrystalline film 103 (to cover the P-type part 103a and the N-type part 103b). Furthermore, a nickel silicide film (not shown) is formed by heat treatment causing a reaction between nickel and silicon.

According to the above-described method, as illustrated in FIG. 5E, the step 121 formed at the interface between the P-type part 103a and the N-type part 103b can be normally tapered. This makes it likely that the step 121 is covered with the nickel film 113 when the nickel film 113 to be silicided is formed on the polycrystalline silicon film 103. As a result, when a nickel silicide film is formed by siliciding the nickel film 113, the nickel silicide film can be restrained from being broken. In this manner, a semiconductor device can be fabricated which suppresses a break in the silicide film and an increase in the resistance of its gate electrode.

In this embodiment, a mixed gas of $CF_4$ and $O_2$ is used for the above-mentioned etching process. However, this is not restrictive. For example, Ar may be used for the etching process. Furthermore, the taper angle A is adjustable according to the conditions under which the step 121 is etched. The taper angle A should be 40 through 60 degrees both inclusive.

In order to provide a region of the polycrystalline silicon film 103 that is not to be silicided, a resist may be formed to cover the region of the polycrystalline silicon film 103 that is not to be silicided before the formation of the nickel film 113. This is the same as in the first embodiment, and thus its detailed description is not given.

Embodiment 3

A semiconductor device according to a third embodiment of the present invention and a fabrication method for the same will be described hereinafter with reference to the drawings.

A field-effect transistor of a dual-gate structure with which the semiconductor device of the present invention is provided also has the same structure as schematically illustrated in FIG. 1. The field-effect transistor of this embodiment is the same as that of the first embodiment, and therefore its detailed description is not given.

Figure 6A:
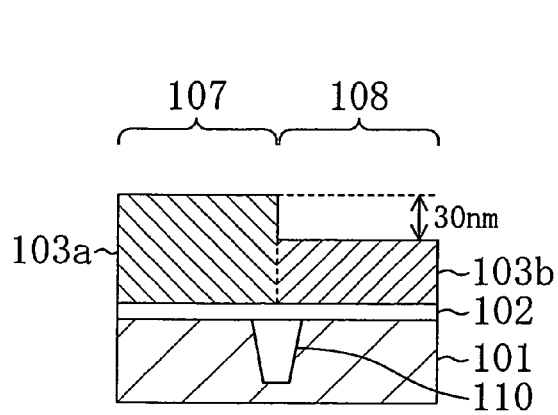
FIGS. 6A through 6D are diagrams for explaining process steps for fabricating a semiconductor device according to a third embodiment of the present invention.

Next, FIGS. 6A through 6D are diagrams for explaining process steps for fabricating the field-effect transistor with which the semiconductor device of this embodiment is provided. In this embodiment, the same process steps as illustrated in FIGS. 5A through 5D of the second embodiment are initially carried out. FIG. 6A is identical with FIG. 5D. More particularly, a P-type part 103a is formed in a polycrystalline silicon film 103 forming part of a gate electrode by implantation of boron ($B^+$) ions representing a P-type impurity into a part of a polycrystalline silicon film 103 located on a first region 107 of a substrate. Furthermore, the top surface of the part thereof is cut away so as to be reduced in thickness by approximately 5 nm. Furthermore, an N-type part 103b is formed in the polycrystalline silicon film 103 by implantation of arsenic (As) ions representing an N-type impurity into a part of the polycrystalline silicon film 103 located on a second region 108 of the substrate. Furthermore, the top surface of the part thereof is cut away so as to be reduced in thickness by approximately 35 nm. In view of the above, the top surface of part of the polycrystalline silicon film 103 located at the interface between the first region 107 and the second region 108 is formed with a step 121.

Figure 6B:
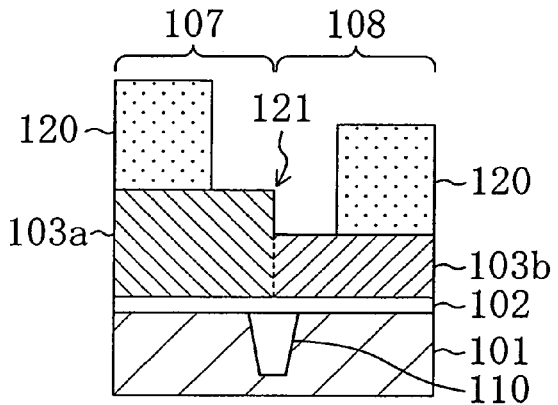
Figure 6C:
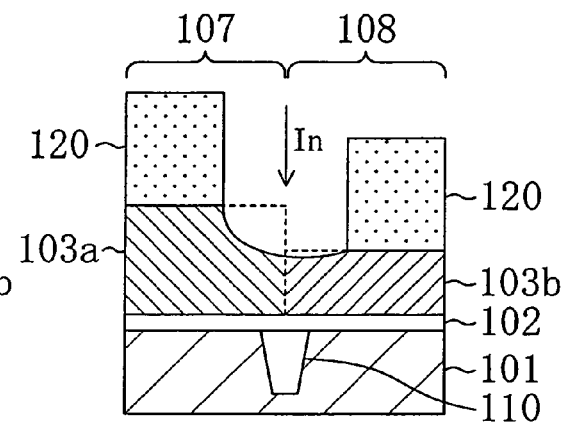
Figure 6D:
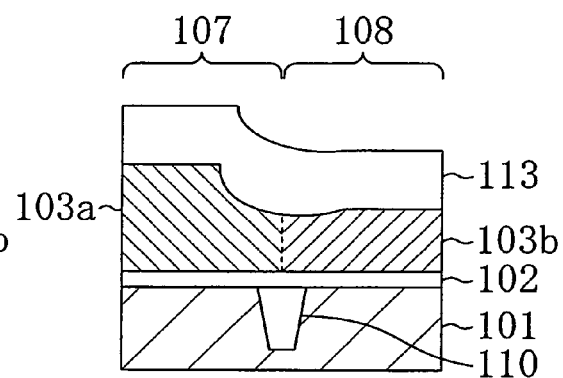
Figure 7:
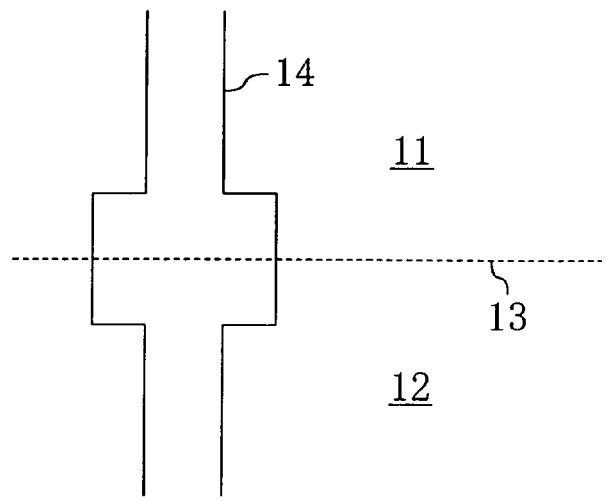
FIG. 7 is a plan view illustrating the structure of a gate electrode of a semiconductor device according to a known art.
Figure 8A:
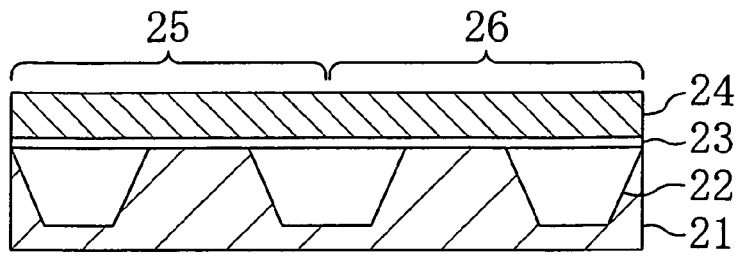
FIGS. 8A through 8E are diagrams for explaining process steps for fabricating a semiconductor device according to any other known art.
Figure 8B:
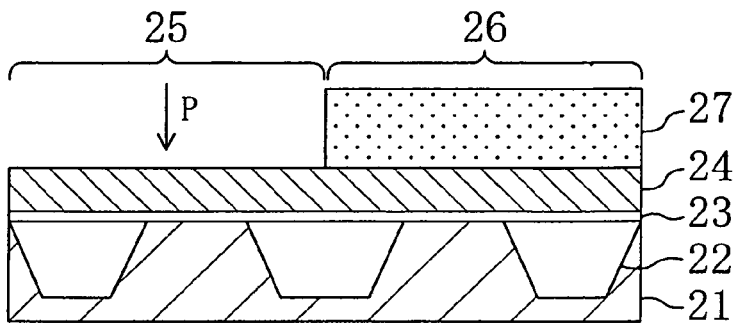
Figure 8C:
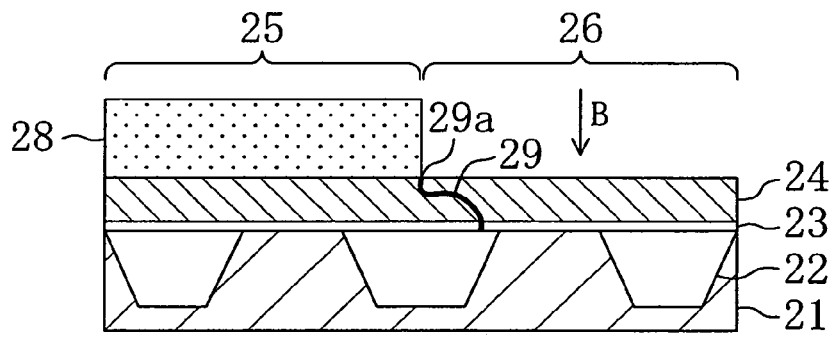
Figure 8D:
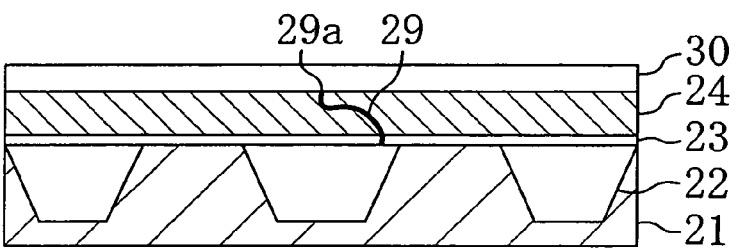
Figure 8E:
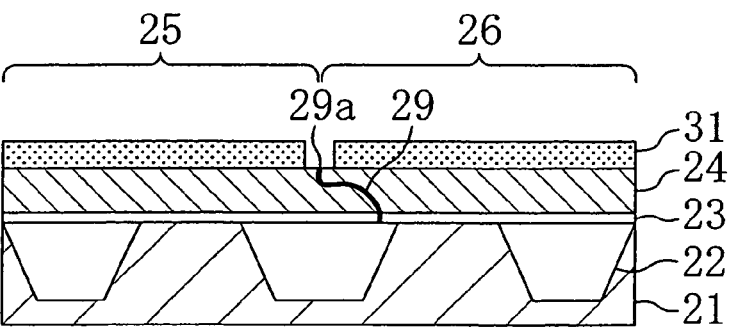

Next, as illustrated in FIG. 6B, a resist 120 is patterned on the polycrystalline silicon film 103 to expose part of the polycrystalline silicon film 103 located at the step 121. Furthermore, as illustrated in FIG. 6C, indium ions are implanted into the part of the polycrystalline silicon film 103 located at the step 121, for example, at an implantation energy of approximately 30 keV and a dose of $5 \times 10^{14}/cm^2$, by using the resist 120 as a mask. In this manner, the top surface of part of the polycrystalline silicon film 103 located at the step 121 is cut away and thus smoothly dented. In other words, part of the polycrystalline silicon film 103 located at the interface between the first region 107 and the second region 108 (the interface between the P-type part 103a and the N-type part 103b) is normally tapered. In this case, the taper angle becomes, for example, approximately 57 degrees.

Thereafter, the resist 120 is removed by a usual method, and, for example, a 10-nm-thick nickel film 113 is formed, as a metal film to be silicided, on the polycrystalline silicon film 103 to cover the first and second regions 107 and 108. Furthermore, a nickel silicide film (not shown) is formed by heat treatment causing a reaction between nickel forming the nickel film 113 and silicon forming the polycrystalline silicon film 103.

According to the above-described method, as illustrated in FIG. 6C, the top surface of part of the polycrystalline silicon film 103 located at the interface between the first region 107 and the second region 108 is removed, thereby eliminating the step 121 formed at the above-described interface. As a result, part of the polycrystalline silicon film 103 located at the interface between the first region 107 and the second region 108 can be normally tapered. Therefore, when the nickel film 113 is formed on the polycrystalline film 103, part of the polycrystalline silicon film 103 located at the above-described interface is also covered with the nickel film 113 with reliability. As a result, when a nickel silicide film is formed by siliciding the nickel film 113, the nickel silicide film is never broken. In this way, a semiconductor device can be fabricated which suppresses a break in the silicide film and an increase in the resistance of its gate electrode.

Furthermore, since ions are not implanted into any other part of the polycrystalline silicon film 103 than the part thereof located at the above-described interface, this can provide stable element characteristics.

In this embodiment, indium ions are implanted into part of a polycrystalline silicon film 103 located at a step 121 thereof. However, like the first embodiment, this is not restrictive. For example, gallium, arsenic, antimony, argon, krypton, or any other element can be used. Furthermore, the taper angle is adjustable according to the conditions under which ions are implanted into the above-mentioned part of the polycrystalline silicon film 103 and should be 40 through 60 degrees both inclusive.

In order to provide a region of the polycrystalline silicon film 103 that is not to be silicided, a resist may be formed to cover the region of the polycrystalline silicon film 103 that is not to be silicided before the formation of the nickel film 113. This is the same as in the first and second embodiments, and thus its detailed description is not given.

As described in the above embodiments, according to the semiconductor device of the present invention and the fabrication method for the same, a semiconductor device of a dual-gate structure including a metal silicide film can prevent the metal silicide film from being broken without causing a decrease in the degree of integration.

In all of the above-mentioned embodiments, a nickel film is formed as a metal film, and a nickel silicide film is formed by a reaction between the nickel film and a polycrystalline silicon film. However, any other metal than nickel, e.g., cobalt, titanium or platinum, can be used to form an associated metal silicide film.

A step of a silicide film formed at the PN junction of a gate electrode of a FET having a dual-gate structure was described above. In addition to this case, the present invention can be applied to a case where the surface of a film on which a silicide film is formed is formed with a step. In other words, a silicide film can be restrained from being broken using a method in which the height of the step is reduced by making the thickness of a polycrystalline silicon film uniform, such as a method in which a corner portion of the step is eliminated so as to be tapered or a method in which the top surface of a region the polycrystalline silicon film located at the step is partly eliminated to form a smooth surface of the polycrystalline silicon film having no step.

What is claimed is:

1. A method for fabricating a semiconductor device of a dual-gate structure comprising a P-channel type field-effect transistor formed at a first region of a substrate and an N-channel type field-effect transistor formed at a second region of the substrate, said method comprising the steps of:
   continuously forming a polycrystalline silicon film on the substrate to cover the first and second regions;
   implanting a P-type impurity into a part of the polycrystalline silicon film located on the first region, thereby forming a P-type part;
   implanting an N-type impurity into a part of the polycrystalline silicon film located on the second region and coming into contact with the P-type part, thereby forming an N-type part;
   forming a metal film on the polycrystalline silicon film; and
   forming a metal silicide film by siliciding the metal film,
   wherein the difference in thickness between the P-type part and the N-type part is produced by the implantation of the P-type impurity and the implantation of the N-type impurity, and
   said method further comprises the step of, before the step of forming the metal silicide layer, normally tapering an end part of the P-type part located above the N-type part and at the interface between the P-type part and the N-type part of the polycrystalline silicon film.

2. The method of claim 1, wherein in the step of normally tapering the end part, the end part is subjected to selective etching.

3. The method of claim 2, wherein the selective etching is dry etching using a mixed gas of $CF_4$ and $O_2$ or an Ar gas.

4. The method of claim 1, wherein a taper angle of the normally tapered end part is 40 through 60 degrees both inclusive.

* * * * *